United States Patent
Gulick et al.

[11] Patent Number: 5,644,277
[45] Date of Patent: Jul. 1, 1997

[54] THREE-WIRE-LINE VERTICAL INTERCONNECT STRUCTURE FOR MULTILEVEL SUBSTRATES

[75] Inventors: Jon J. Gulick, Hawthorne; John J. Wooldridge, Manhattan Beach, both of Calif.

[73] Assignee: Hughes Aircraft Company, Los Angeles, Calif.

[21] Appl. No.: 553,946

[22] Filed: Nov. 6, 1995

Related U.S. Application Data

[63] Continuation-in-part of Ser. No. 395,220, Feb. 27, 1995, abandoned.

[51] Int. Cl.$^6$ ..................................................... H01P 5/00
[52] U.S. Cl. ........................ 333/246; 333/247; 361/790
[58] Field of Search ............................. 333/33, 238, 246, 333/247; 361/735, 744, 778, 785, 789, 790; 439/930

[56] References Cited

U.S. PATENT DOCUMENTS

| | | | |
|---|---|---|---|
| 3,895,435 | 7/1975 | Turner et al. | 333/238 X |
| 4,543,544 | 9/1985 | Ziegner | 333/238 X |
| 5,057,798 | 10/1991 | Moye et al. | 333/33 |
| 5,266,912 | 11/1993 | Kledzik | 333/247 |
| 5,294,897 | 3/1994 | Notani et al. | 333/246 X |
| 5,424,693 | 6/1995 | Lin | 333/246 X |
| 5,552,752 | 9/1996 | Sturdivant et al. | 333/246 X |

*Primary Examiner*—Paul Gensler
*Attorney, Agent, or Firm*—Leonard A. Alkov; Wanda K. Denson-Low

[57] ABSTRACT

A vertical interconnect structure comprising a three-wire-line transmission line structure for providing electrical continuity between different levels of a multilevel substrate. The present invention provides a means for transferring power between various levels of the substrate without introducing excessive additional RF losses. First and second coplanar transmission line structures are disposed on first and second surfaces of the substrate. A vertical interconnect structure is disposed in the multilevel RF substrate and is coupled between the first and second transmission line structures. The vertical interconnect structure comprises three conductors having predetermined cross-sectional dimensions and predetermined separations therebetween that are adapted to transfer RF power between the first and second transmission line structures. In a completed electronic circuit employing the present invention, an electronic device is electrically coupled between two coplanar transmission line structures disposed on one surface of the substrate, and the vertical interconnect structure couples power to the electronic circuit by way of the coplanar transmission line structure disposed another surface of the substrate. The impedance of the vertical interconnect structure is determined by the relative dimensions of the three conductors and their relative separations. The three-wire-line transmission line structure supports a highly desirable TEM mode of energy propagation. The present invention is relatively easy to fabricate, in that vertical wires having a circular geometry are easily accommodated as part of the fabrication process for the substrate. The present invention provides for relatively low loss, because of the nature of the currents that flow on the conductors. The propagation characteristics are well-understood, and the vertical interconnect structure supports a highly desirable TEM mode of energy propagation.

16 Claims, 6 Drawing Sheets

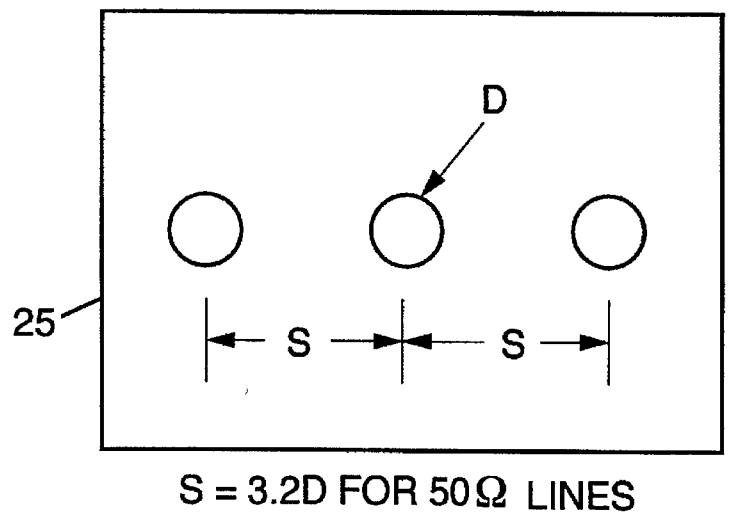
S = 3.2D FOR 50Ω LINES
FIG. 4a.
FIG. 4b.
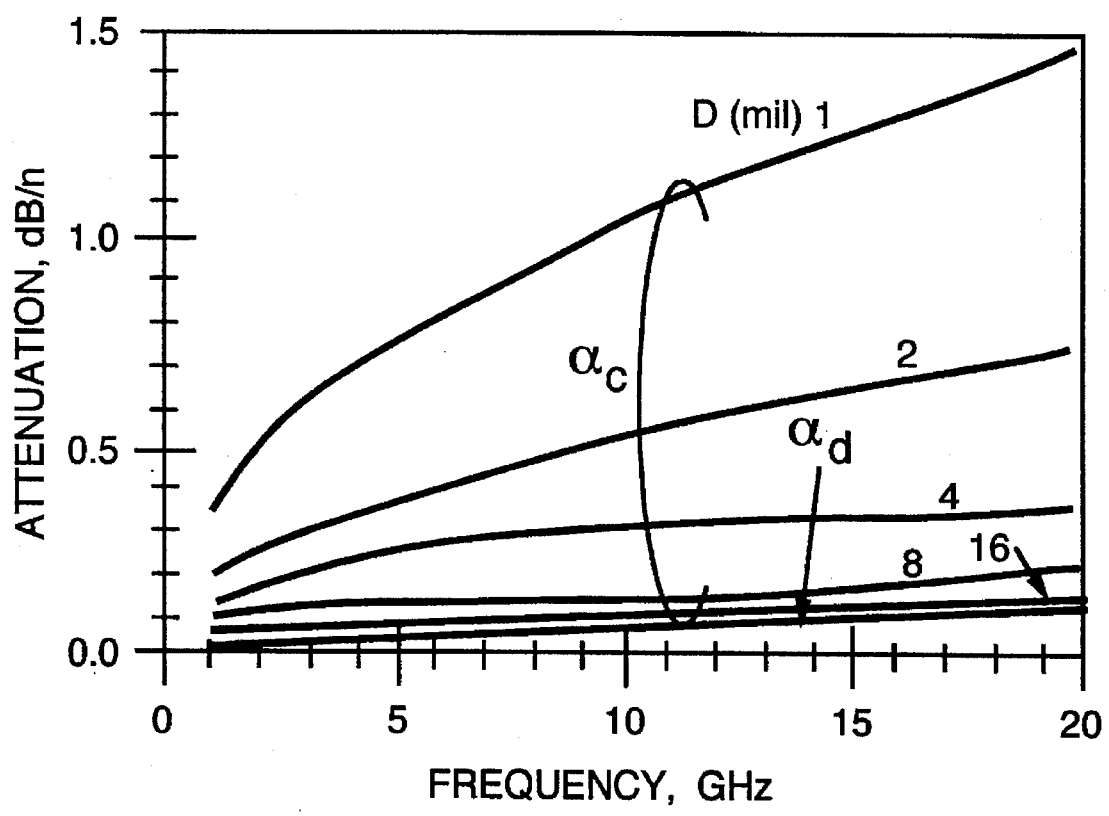

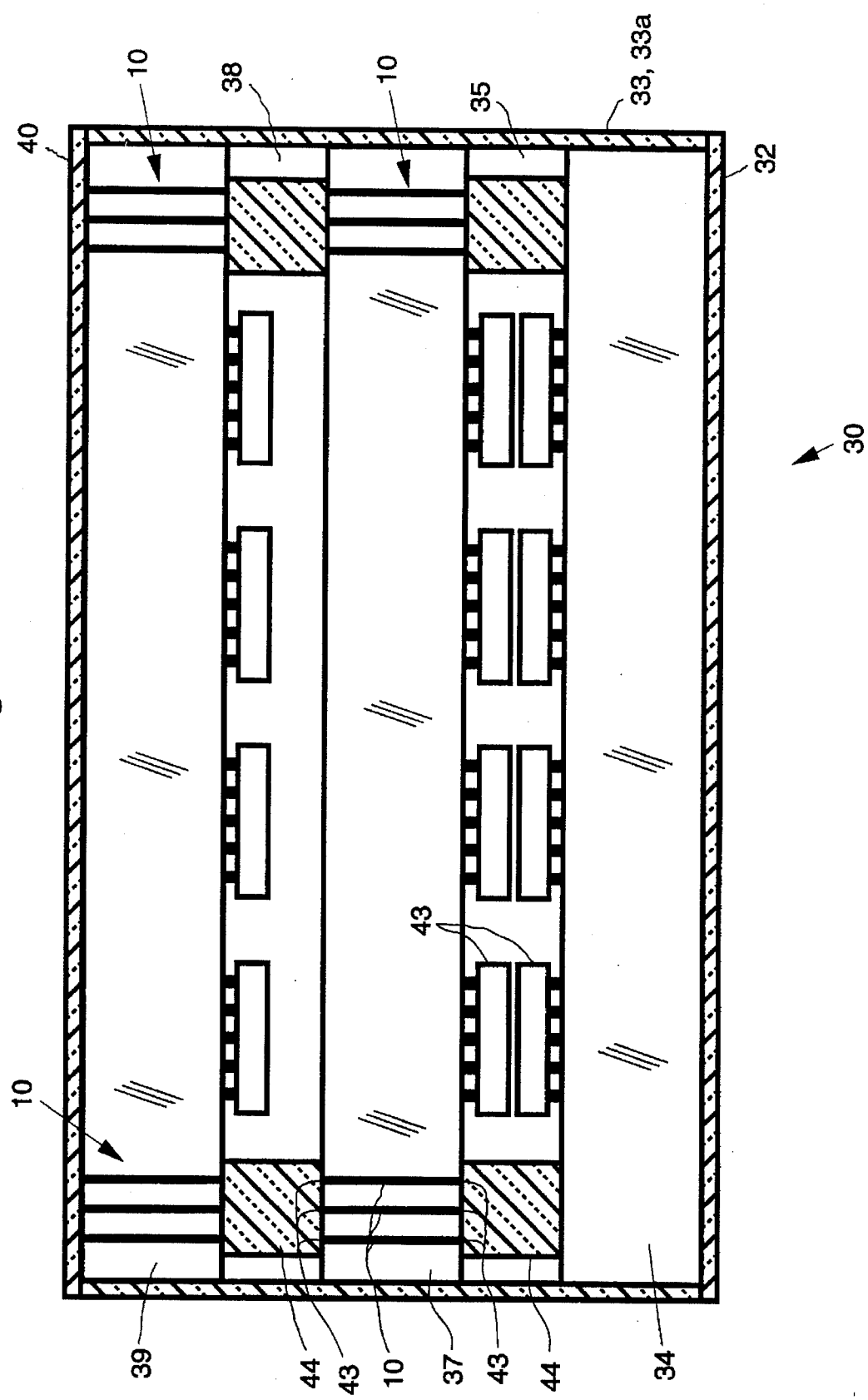

THREE-WIRE-LINE VERTICAL INTERCONNECT STRUCTURE FOR MULTILEVEL SUBSTRATES

CROSS REFERENCE TO RELATED APPLICATIONS

The present invention is a continuation-in-part of U.S. patent application Ser. No. 08/395,220, filed: Feb. 27, 1995, now abandoned.

BACKGROUND

The present invention relates generally to vertical interconnect structures, and more particularly, to a three-wire-line vertical interconnect structure for use in interconnecting components disposed on a multilevel RF substrate.

Design engineers are just now beginning to take full advantage of the flexibility of multilevel substrates for RF circuitry. Good RF performance depends on the ability to transfer power between the various levels of the substrate without introducing excessive additional RF loss. The assignee of the present invention has developed an interconnect structure to provide for this type of interconnectivity that relates to planar radiator and RF interconnects. This is a coaxial feedline approach, but is relatively complicated, and is potentially difficult to fabricate. Furthermore, the coplanar waveguide feedline uses an edge-coupled device which may introduce greater RF loss than the structure of the present invention.

Active array radars for airborne applications typically require over 2000 transmit/receive modules per installation. Consequently, in order to provide for relatively affordable radars, each transmit/receive module should be made as inexpensively as possible, without sacrificing performance. The use of multilevel substrates provides a means for this goal to be reached, and also reduce the size and weight for airborne and space applications.

Therefore, it is an objective of the present invention to provide a vertical interconnect structure for use in interconnecting components disposed on a multilevel RF substrate that is adapted to transfer power between various levels of the substrate without introducing excessive additional loss.

SUMMARY OF THE INVENTION

In order to meet the above and other objectives, the present invention comprises a three-wire-line transmission structure that is adapted to provide DC and RF electrical continuity between different levels of a multilevel substrate and stacked multilevel substrate modules having substrates interconnected by means of three-wire-line vertical interconnect structures and solderless interconnects. Prior vertical interconnects have not made use of the particular guiding structure employed in the present invention. The present invention provides a means for transferring power between various levels of the substrate without introducing excessive additional RF losses.

More particularly, in its most basic form, the present invention comprises a multilevel RF substrate made of a relatively homogeneous dielectric material. A first coplanar transmission line structure is disposed on a first surface of the multilevel RF substrate. A second coplanar transmission line structure is disposed on a second surface of the multilevel RF substrate. A vertical interconnect structure is disposed in the multilevel RF substrate and is coupled between the first and second transmission line structures. The vertical interconnect structure comprises three conductors having predetermined cross-sectional dimensions and predetermined separations therebetween that are adapted to transfer RF power between the first and second transmission line structures.

In a completed electronic circuit employing the present invention, an electronic device is electrically coupled between two coplanar transmission line structures disposed on one surface of the substrate, and the vertical interconnect structure couples power to the electronic circuit by way of the coplanar transmission line structure disposed on another surface of the substrate. Typically, the three conductors of the vertical interconnect structure have a circular cross-section, but are not limited thereto. The conductors are typically comprised of a metal, such as tungsten, or molybdenum, for example. The dielectric material is typically comprised of a ceramic, such as aluminum nitride, for example. The impedance of the vertical interconnect structure is determined by the relative dimensions of the three conductors and their relative separations.

There are three primary advantages provided by the present invention. It is relatively easy to fabricate, in that vertical wires having a circular geometry are easily accommodated as part of the fabrication process for the substrate. The three-wire-line transmission line structure of the present invention provides for relatively low loss, because of the nature of the currents that flow thereon. Finally, the propagation characteristics of the present structure are well-understood. The three-wire-line transmission line structure supports a highly desirable TEM mode of energy propagation.

With regard to the active array radars for airborne applications mentioned above, using the multilevel substrates of the present invention provides a means for this goal to be reached. The present invention helps to ensure that those transmit/receive modules that use multilevel substrates satisfy performance specifications. In addition to the cost savings, the depth and weight of the radar are reduced by a factor of about six using the present invention, thus allowing installation of the radar into confined spaces of missiles and spacecraft, and conformal installations on the skins of aircraft.

Another aspect of the present invention provides for a stacked multilevel substrate module, such as a stacked transmit/receive module, that comprises a plurality of stacked substrates or tiles that in an operative radar embodiment of the present invention may include low noise and power amplifier substrates and a common leg substrate (used for transmission and reception) that are disposed in an enclosure. The plurality of stacked substrates have coplanar interconnects disposed on selected surfaces thereof that couple received signals to the components of the respective amplifier and common leg substrates or tiles. The plurality of stacked substrates are separated by a plurality of ring frames that comprise solderless interconnects, such as fuzzax or fuzz buttons, or similar interconnects, that are used to couple signals between circuits of the respective substrates. A plurality of three wire vertical interconnect structures or transmission lines are disposed through a central substrate and connect to selected solderless interconnects on the adjacent ring frames. A plurality of seal rings and optional thermal gaskets fully enclose the stacked transmit/receive module which are sealed to the enclosure at opposite ends thereof.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 4a shows another geometrical configuration of the three-wire-line interconnect structure of the present invention;

FIG. 4b shows the calculated attenuation of a microwave signal as a function of via diameter;

FIG. 6 illustrates a cross sectional view of an assembled stacked multilevel substrate module of FIG. 5.

DETAILED DESCRIPTION

Figure 1A:
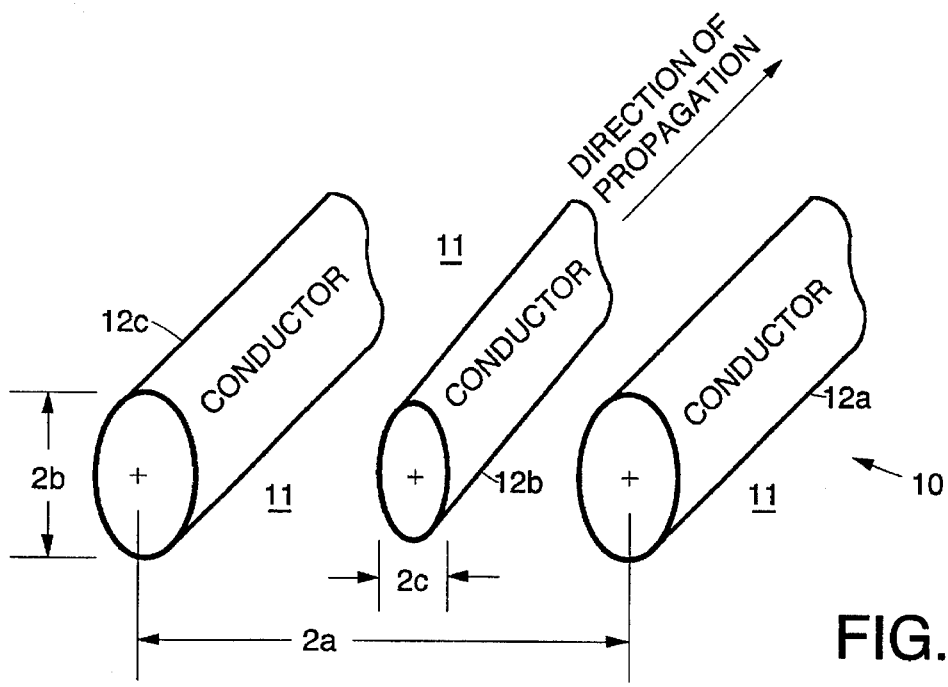
FIG. 1a shows a perspective view of an embodiment of a three-wire-line transmission structure in accordance with the principles of the present invention.

Referring to the drawing figures, FIG. 1a shows a perspective view of an embodiment of a three-wire-line transmission structure 10 in accordance with the principles of the present invention. The three-wire-line transmission structure 10 is comprised of three conductors 12a, 12b, 12c which are adapted to be embedded in a relatively homogeneous dielectric material 11. The dielectric material may be comprised of aluminum nitride, or alumina, for example. The three conductors 12a, 12b, 12c are shown having different dimensions, cross-sectional shapes, and relative spacings therebetween indicated as dimensions 2a, 2b, 2c, respectively. The three conductors 12a, 12b, 12c may be comprised of a metal such as tungsten, or molybdenum, for example.

Figure 1B:
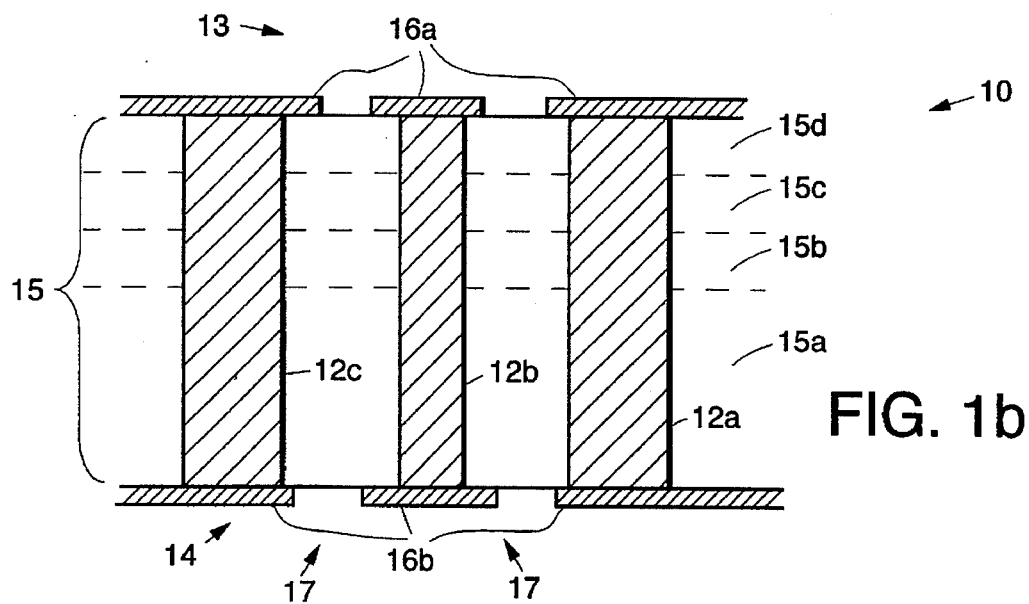
FIG. 1b shows a side view of the three-wire-line transmission structure of the present invention.

FIG. 1b shows a side view of the three-wire-line transmission structure 10 of FIG. 1a. The illustration of FIG. 1b illustrates how the structure 10 may be used to provide interconnection between two coplanar transmission lines or waveguides 13, 14 that are disposed on surfaces of different layers of a multilayer substrate 15. The coplanar transmission lines or waveguides 13, 14 are each comprised of respective upper and lower coplanar conductor layers or transmission line layers 16a, 16b having gaps 17 therebetween that transmit RF energy. The use of the present structure 10 works equally well with other types of surface transmission lines, such as microstrip transmission lines, for example. The three conductors 12a, 12b, 12c are respectively coupled between corresponding coplanar conductor layers of the two coplanar transmission lines 13, 14 through each layer (for example conductor layers 15a, 15b, 15c, 15d) of the multilayer substrate 15.

Figure 1C:
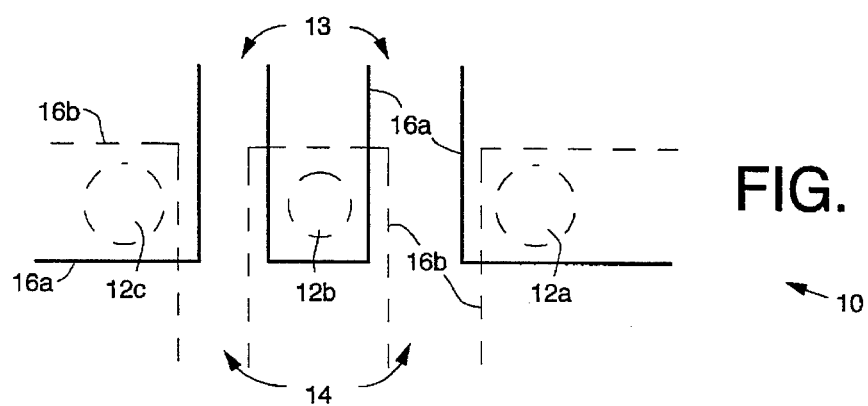
FIG. 1c shows a top view of the three-wire-line transmission structure of FIG. 1b.

FIG. 1c shows a top view of the three-wire-line transmission structure 10 of FIG. 1b. The three conductors 12a, 12b, 12c and the lower coplanar metal layer 16b are shown in phantom, indicating their location below the upper coplanar conductor layer 16a and the multilayer substrate 15.

Figure 2:
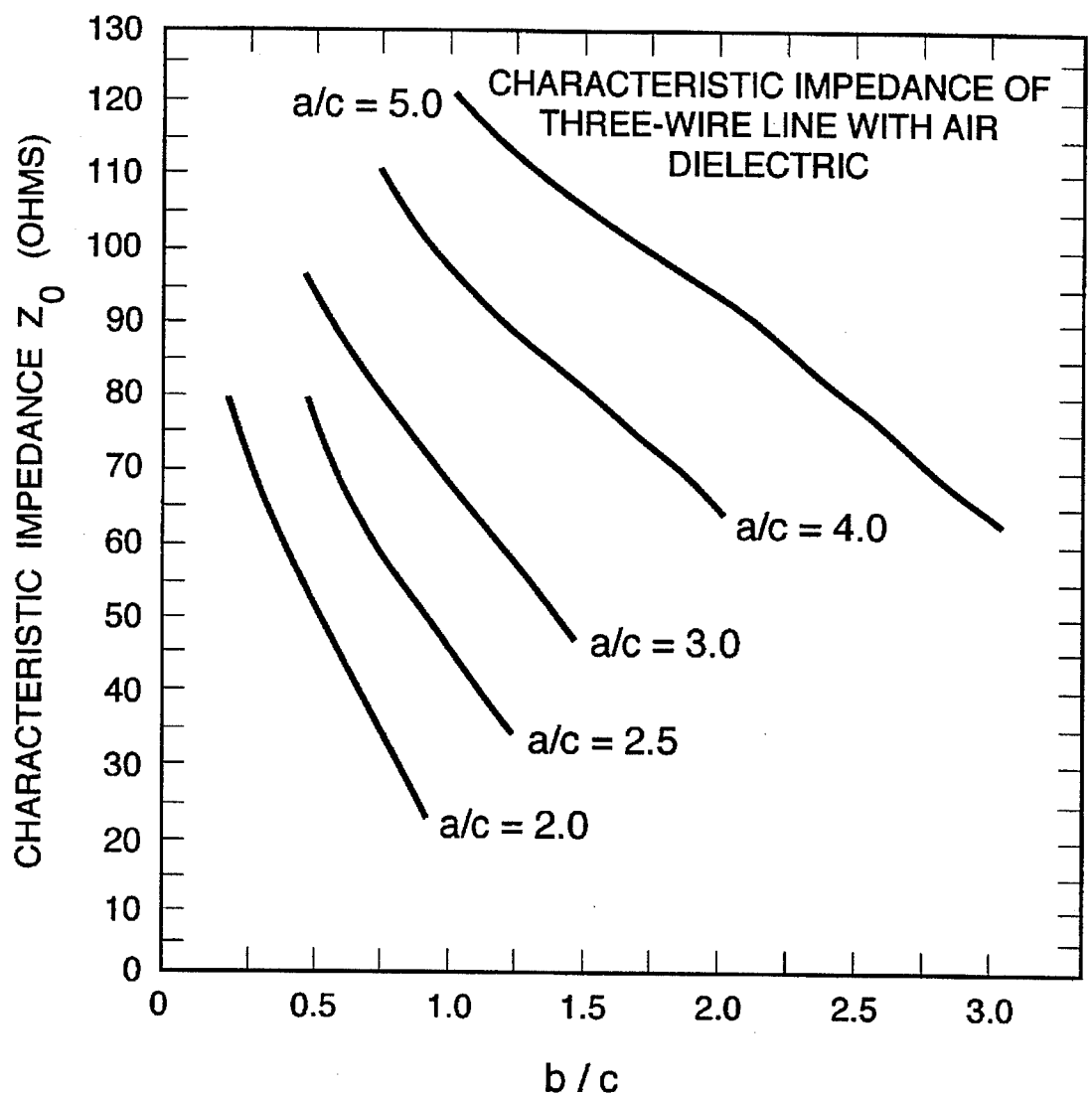
FIG. 2 shows characteristic impedance of the three-wire-line transmission structure of the present invention.

The present three-wire-line transmission structure 10 supports transmission of a pure transverse electromagnetic (TEM) wave and consequently the phase velocity in the structure 10 is the speed of light divided by the index of refraction of the dielectric material. The impedance of the three-wire-line transmission line structure 10 is determined by the relative dimensions of the three conductors 12a, 12b, 12c and their separations, as is indicated in FIG. 2. More specifically, FIG. 2 shows characteristic impedance of the three-wire-line transmission structure of the present invention using air dielectric. This graph applies directly for the case of air used as the dielectric material 11. If the three-wire-line transmission line structure 10 is embedded in another type dielectric material 11, then the impedance values indicated must be divided by the index of refraction of the dielectric material 11 to arrive at the true characteristic impedance for the structure 10. In the general case, all three conductors 12a, 12b, 12c differ in diameter and the spacings are asymmetrical.

Figure 3A:
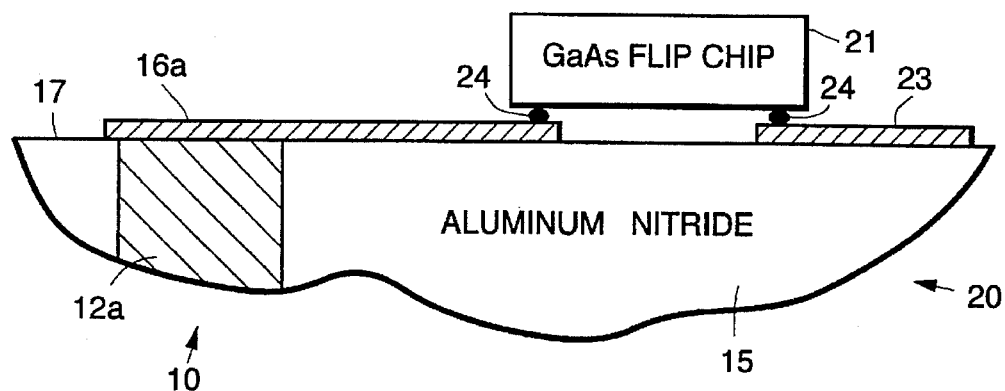
FIGS. 3a and 3b illustrate partially cutaway side and top views, respectively, of an exemplary RF structure employing the three-wire-line transmission structure of the present invention.
Figure 3B:
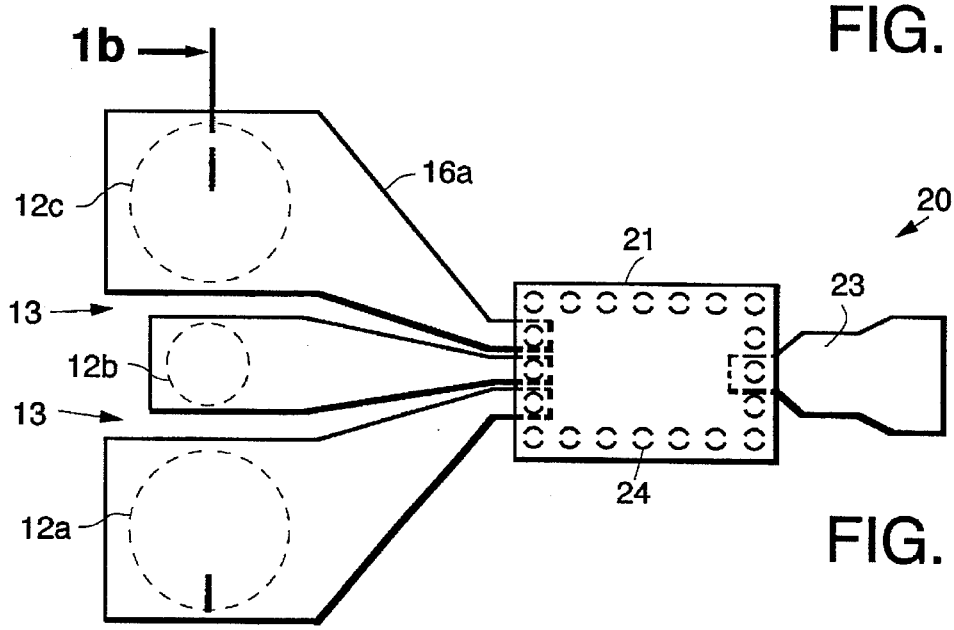

FIGS. 3a and 3b illustrate partially cutaway side and top views, respectively, of an exemplary RF structure 20 employing the three-wire-line transmission structure 10 of the present invention. In the exemplary RF structure 20 the three-wire-line vertical interconnect structure 10 interfaces with a coplanar waveguide 13 on a top surface 17 of an aluminum nitride substrate 15, for example, which in turn terminates at an electronic device, such as a flip chip MMIC device 21, for example. The three conductors 12a, 12b, 12c are respectively coupled to the individual conductors of the conductor layer 16a.

A microstrip transmission line 23 is also disposed on the top surface 17 of the aluminum nitride substrate 15 and terminates at the flip chip MMIC device 21. The flip chip MMIC device 21 may be coupled to the coplanar waveguide 13 and microstrip transmission line 23 by means of conventional bonds 24, such as may be made by elastomeric, solder, or z-axis filament bonding techniques, for example. The bottom end of the vertical interconnect structure 10 (not shown) may be connected to a MMIC device on another layer, a silicon VLSI chip, or a radiating element such as a patch antenna, for example in a manner similar to that described for the flip chip MMIC device 21.

Figure 3C:
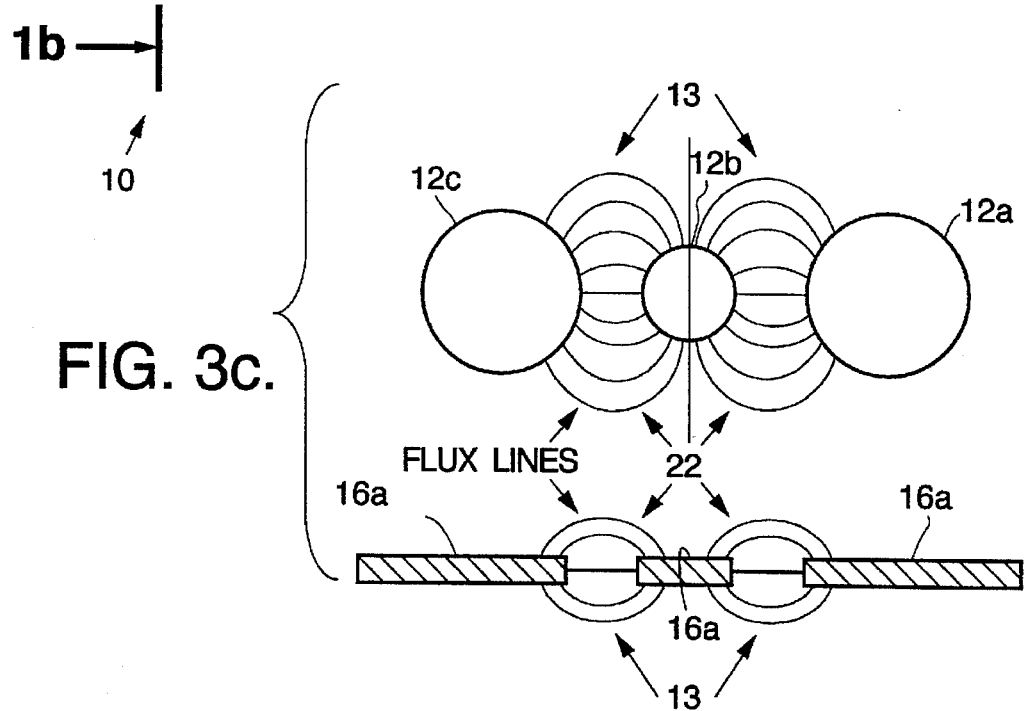
FIG. 3c shows top and side views, respectively, of the contours of the electric field flux lines for the coplanar waveguide and three-wire-line transmission structure of the exemplary RF structure shown in FIGS. 3a and 3b.

FIG. 3c shows top and side views, respectively, of the contours of electric field flux lines 22 for the coplanar waveguide 13 and three-wire-line transmission structure 10 of the exemplary RF structure 20 shown in FIGS. 3a and 3b. It is apparent that the electric field lines 22 are only slightly perturbed during transition from one structure to the other. This provides for a relatively good, low loss RF transition.

FIG. 4a shows another geometrical configuration of the three-wire-line interconnect structure 10 of the present invention. FIG. 4 illustrates the spacing of the conductors 12 in a dielectric with a relative dielectric constant of 8.5. With the equal spacing, a 50 ohm transmission line may be created by making the center-to-center spacing between the conductors 12 3.2 times the diameter of the conductors 12. FIG. 4a also shows a box 25 at whose edge the electric field is reduced by a factor of 20 compared to the electric field between the conductors 12.

FIG. 4b shows the calculated attenuation of a microwave signal as a function of diameter of the conductors 12. As the diameter is increased, the conducting surface area of the microwave current within the metal conductors 12 is increased, reducing the resistive loss. As the diameter of the conductors 12 approaches 16 mils, the resistive loss of the conductors 12 ($\alpha_c$) becomes equal to the dielectric loss ($\alpha_d$) of the material 11 (aluminum nitride) and further increase in diameter of the conductors 12 will not reduce the overall loss. The calculation was performed for pure tungsten metal which is used with high temperature cofired aluminum nitride. Typical diameters of the conductors 12 are about 10 mils, so that the attenuation through a typical 100 mil thick substrate 15 is less than 0.02 dB providing excellent transmission of the microwave energy. These calculations have been verified by measurements on aluminum nitrate substrates 15 that are 30 mils thick.

Figure 5:
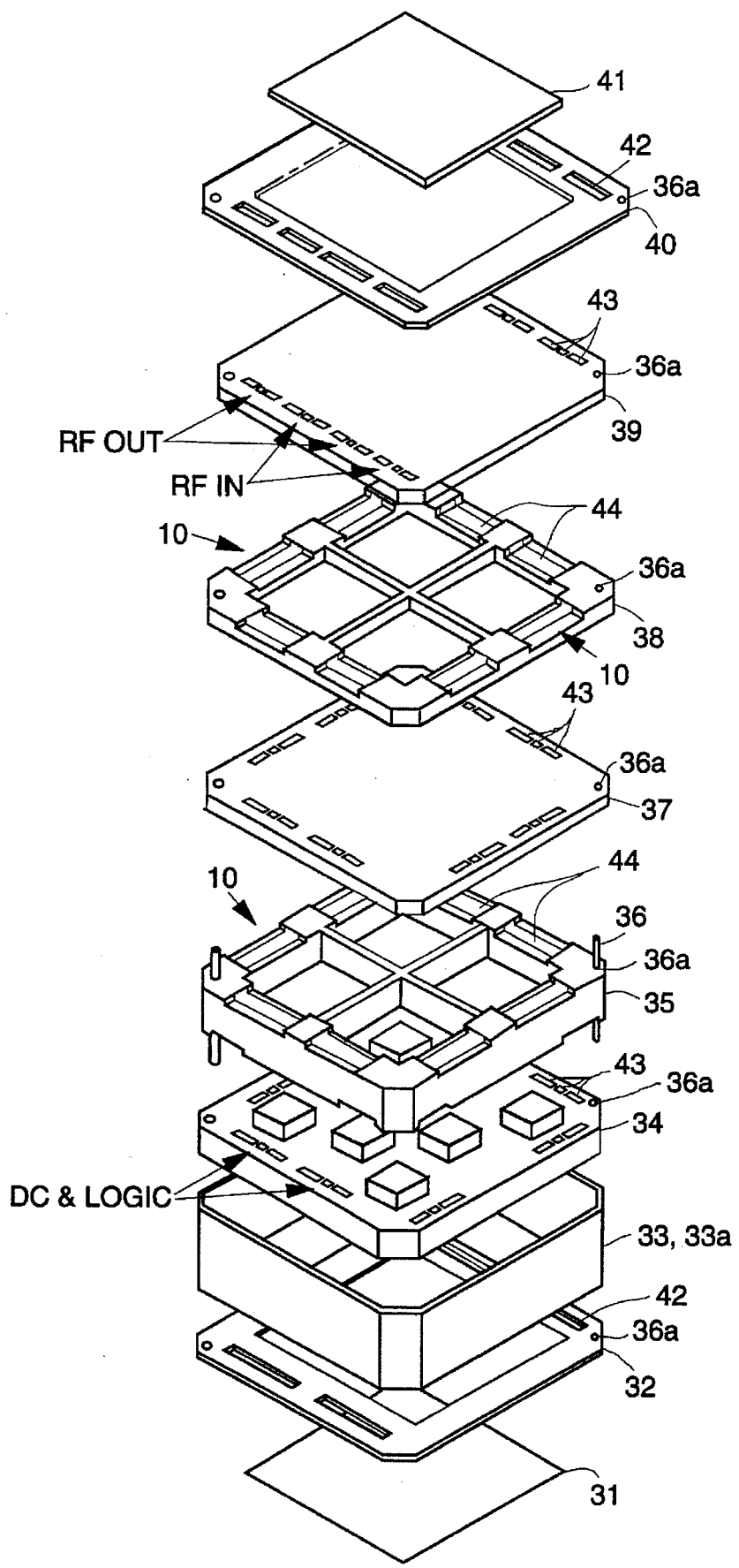
FIG. 5 illustrates an exploded perspective view of a four element stacked multilevel substrate module in accordance with the present invention.

Referring now to FIG. 5, it illustrates an exploded perspective view of a four element stacked multilevel substrate module 30 in accordance with the present invention, and which for illustrative purposes is shown as a stacked transmit/receive module 30 of a radar system. The stacked multilevel substrate module 30 or transmit/receive module 30 comprises within an enclosure 33 comprising a housing sleeve 33a that may be comprised of an iron nickel alloy material such as Kovar™ material, for example, which forms an outer enclosure 33 for the module 30. The housing sleeve 33a may be sealed at a lower end by means of a lower seal ring 32 that may comprise iron nickel alloy material for example, and that may be seam sealed, for example, to the housing sleeve 33a and a thermal gasket 31 that is sealed to the lower seal ring 32. The lower seal ring 32 and hence the enclosure 33, has a plurality of openings 42 therein that permit electrical connection of the module 30 to external circuits.

A plurality of substrates 34, 37, 39 and ring frames 35, 38 are stacked within the housing sleeve 33a in a manner generally indicated below, which should not be taken as limiting the present invention. For the purposes of this disclosure, the stacked substrates comprise a lower common leg substrate 34 that comprises a multilayer aluminum nitride printed circuit having a plurality of electronic devices disposed on an upper surface thereof and interconnected to the printed circuit in flip-chip fashion, for example. A plurality of coplanar stripline, DC and logic conductors 43 are disposed on upper and lower surfaces of the common leg substrate 34 that are used to transmit and receive electrical signals. The plurality of openings 42 in the lower seal ring 32 are coincident with the coplanar stripline, DC and logic conductors 43 on the lower surface of the common leg substrate 34 and are connected to circuits outside the module 30.

A lower ring frame 35 which may be made of aluminum, for example, is disposed adjacent to the common leg substrate 34 and has a plurality of alignment pins 36 that slide through alignment holes 36a disposed in the common leg substrate 34 and other substrates 37, 39 and ring frame 38 of the module 30. The lower ring frame 35 has a plurality of solderless interconnects 44 disposed therethrough (shown more clearly in FIG. 6), which may comprise fuzzax or fuzz buttons, or similar interconnects, that are used to couple signals between circuits of the respective substrates 34, 37, 39. Surfaces of the solderless interconnects 44 adjacent the lower surface of the lower ring frame 35 make connection with the coplanar DC and logic conductors 43 disposed on the upper surface of the common leg substrate 34. The lower ring frame 35 is generally open at its center, although support ribs may be formed across the opening to provide structural strength and RF shielding. The lower ring frame 35 is open to permit the electronic components of the common leg substrate 34 to reside in the open space thereof.

A center low noise amplifier or driver substrate 37, which comprises a multilevel substrate, is centrally disposed in the housing sleeve 33a adjacent the upper surface of the lower ring frame 35. A plurality of three wire vertical interconnect structures 10 extend through peripheral edges of the low noise amplifier substrate 37 and contact the solderless interconnects 44 disposed through the lower ring frame 35.

An upper ring frame 38 having a structure similar to the lower ring frame 35 is disposed adjacent to an upper surface of the low noise amplifier substrate 37 and makes electrical contact with coplanar conductors 43 thereon by means of its solderless interconnects 44. An upper high power amplifier substrate 39, which comprises a multilevel substrate, is disposed in the housing sleeve 33a adjacent the upper surface of the upper ring frame 38. Solderless interconnects 44 of the upper ring frame 38 connect to coplanar conductors 43 disposed on a lower surface of the high power amplifier substrate 39. Pluralities of three wire vertical interconnect structures 10 are disposed through the high power amplifier substrate 39. RF input and output signals are transmitted through the vertical interconnect structures 10 of the high power amplifier substrate 39.

The plurality of three wire vertical interconnect structures 10 of the low noise amplifier or driver substrate 37 (center substrate 37 of the module 30) couple signals through the low noise amplifier or driver substrate 37. Thus, signal paths are provided from the common leg substrate 34 (bottom substrate of the module 30) to the top substrate of the module 30 using the plurality of three wire vertical interconnect structures 10 through the center substrate. Selected solderless interconnects 44 disposed through the respective ring frames 35, 38 are used to interface between the DC and logic signals and the three wire vertical interconnect structures 10 and coplanar conductors 43 of the common leg substrate 34 and upper high power amplifier substrate 39.

The housing sleeve 33a may be sealed at an upper end using an upper seal ring 40 similar to the lower seal ring 32 that may be seam sealed, for example, to the housing sleeve 33a and a thermal gasket 41 may be sealed to the upper seal ring 40. The upper seal ring 40 has a plurality of openings 42 therein that are coincident with coplanar conductors 43 disposed on an upper surface of the high power amplifier substrate 39 and which permit connection to circuits outside the module 30. The module 30 provides for a hermetically sealed package by using the lower and upper seal rings 32, 40, thermal gaskets 31, 41, and housing sleeve 33a, sealed by the seam sealing techniques, or the like.

Referring to FIG. 6, it illustrates a cross sectional view of an assembled stacked multilevel substrate module 30 of FIG. 5. Details of the three wire vertical interconnect structures 10 that extend through the high power amplifier substrate 39 and low noise amplifier substrate 37 and connect to the solderless interconnects 44 disposed through the respective ring frames 35, 38 are shown more clearly in FIG. 6. The locations of the electronic devices that form part of the printed circuits of the respective substrates 34, 37, 39 are also shown.

Thus there has been described a new and improved three-wire-line vertical interconnect structure for use in interconnecting components disposed on a multilevel RF substrate and stacked multilevel substrate modules having substrates interconnected by means of three-wire-line vertical interconnect structures and solderless interconnects. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A stacked multilevel substrate module comprising:

an enclosure having a plurality of openings that permit electrical connection to external circuits;

lower, center, and upper substrates stacked within the enclosure each comprising an electronic circuit having plurality of coplanar conductors disposed on upper and lower surfaces thereof that are used to transmit and receive electrical signals, and wherein the center substrate comprises a plurality of three wire vertical interconnect structures that extend through peripheral edges thereof lower and upper ring frames interposed between the respective substrates each comprising a plurality of solderless interconnects disposed therethrough, and wherein predetermined ones of the solderless interconnects contact predetermined ones of the three wire vertical interconnect structures of the center substrate; and a plurality of alignment pins disposed through alignment holes disposed through the substrates and ring frames.

2. The stacked multilevel substrate module of claim 1 wherein the center substrate comprises:

a multilevel RF substrate comprising a relatively homogeneous dielectric material;

first and second coplanar transmission line structures respectively disposed on first and second surfaces of the multilevel RF substrate; and a vertical interconnect structure disposed in the multilevel RF substrate that is coupled between the first and second coplanar transmission line structures, and which comprises three conductors having predetermined cross-sectional dimensions and predetermined separations therebetween for transferring RF power between the respective coplanar transmission line structures disposed on the multilevel RF substrate, and wherein the impedance of the vertical interconnect structure is determined by the relative dimensions of the three conductors and their relative separations.

3. The stacked multilevel substrate module of claim 2 wherein the dielectric material is comprised of aluminum nitride.

4. The stacked multilevel substrate module of claim 1 wherein the enclosure comprises:

a housing;

a lower seal ring having a plurality of openings therein that permit electrical connection of the module to external circuits, and a thermal gasket that seals the housing at a lower end thereof; and an upper seal ring having a plurality of openings therein that permit electrical connection of the module to external circuits, and a thermal gasket that seals the housing at an upper end thereof.

5. The stacked multilevel substrate module of claim 4 wherein each vertical interconnect structure supports transmission of a transverse electromagnetic (TEM) wave.

6. The stacked multilevel substrate module of claim 4 wherein the lower and upper seal rings comprise iron nickel alloy material.

7. The stacked multilevel substrate module of claim 4 wherein the lower and upper seal rings are seam sealed to the housing.

8. The stacked multilevel substrate module of claim 4 wherein the lower, center, and upper substrates comprise multilayer aluminum nitride printed circuits.

9. The stacked multilevel substrate module of claim 4 wherein the lower and upper ring frames comprise aluminum.

10. The stacked multilevel substrate module of claim 4 wherein the plurality of solderless interconnects comprise fuzzax.

11. The stacked multilevel substrate module of claim 4 wherein the plurality of solderless interconnects comprise fuzz buttons.

12. The stacked multilevel substrate module of claim 4 wherein the lower and upper ring frames are open at their centers, and have support ribs disposed across the openings.

13. The stacked multilevel substrate module of claim 12 wherein the conductors have a circular cross-section.

14. The stacked multilevel substrate module of claim 12 wherein the conductors are comprised of tungsten.

15. The stacked multilevel substrate module of claim 12 wherein the conductors are comprised of molybdenum.

16. The stacked multilevel substrate module of claim 4 wherein the plurality of three wire vertical interconnect structures extend through peripheral edges of the center substrate and contact selected ones of the solderless interconnects disposed through the lower and upper ring frames.

* * * * *